(12) United States Patent
Chen et al.

(10) Patent No.: US 8,288,081 B2
(45) Date of Patent: Oct. 16, 2012

(54) METHOD AND SYSTEM FOR EXPOSURE OF A PHASE SHIFT MASK

(75) Inventors: Chih-Ming Chen, Taoyuan County (TW); Ya-Ping Tseng, Taoyuan County (TW); Ming-Tao Ho, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1028 days.

(21) Appl. No.: 11/695,186

(22) Filed: Apr. 2, 2007

(65) Prior Publication Data

US 2008/0241707 A1 Oct. 2, 2008

(51) Int. Cl.
*G03F 1/00* (2012.01)

(52) U.S. Cl. ............ 430/316; 430/318; 430/317; 430/5; 430/313; 430/394

(58) Field of Classification Search ......................... None
See application file for complete search history.

(56) References Cited

U.S. PATENT DOCUMENTS

| | | | |
|---|---|---|---|
| 5,783,337 A | 7/1998 | Tzu et al. | |
| 6,724,968 B2 * | 4/2004 | Lackritz et al. | 385/131 |
| 6,821,689 B2 | 11/2004 | Pierrat | |
| 2003/0211399 A1 * | 11/2003 | Chang | 430/5 |
| 2004/0048166 A1 | 3/2004 | Chang | |
| 2004/0074868 A1 | 4/2004 | Chang | |
| 2005/0208390 A1 | 9/2005 | Xiao | |
| 2007/0015089 A1 * | 1/2007 | Peters et al. | 430/313 |

OTHER PUBLICATIONS

Chinese Patent Office, Office Action mailed May 6, 2010, Application No. 200710142661.8. 5 pages.

* cited by examiner

*Primary Examiner* — Daborah Chacko Davis
(74) *Attorney, Agent, or Firm* — Haynes and Boone, LLP (57) ABSTRACT

The present disclosure provides a method of making a mask. The method includes providing a substrate having a first attenuating layer on the substrate and a first imaging layer on the first attenuating layer; performing a first exposure to the first imaging layer using a first radiation energy in writing mode; performing a first etching to the first attenuating layer; performing a second etching to the substrate; forming a second imaging layer on the first attenuating layer and the substrate; performing a second exposure to the second imaging layer using a light energy and another mask; and performing a third etching to the first attenuating layer after the second exposure.

20 Claims, 11 Drawing Sheets

METHOD AND SYSTEM FOR EXPOSURE OF A PHASE SHIFT MASK

BACKGROUND

The present disclosure relates in general to semiconductor manufacturing technology, and more particularly, to a process of making and using photomasks or masks. The present disclosure also relates to a method and system for exposing a phase-shift mask in the semiconductor manufacturing process.

In semiconductor manufacturing technology, phase-shift masks (PSM) have been used to overcome problems associated with light diffraction and to enhance the lithography exposure resolution. Currently, in the process of making a PSM, a user-supplied pattern is produced on the PSM by an electron beam (e-beam) or laser writing lithography process. Typically, the time it takes to make a single mask with one of these types of systems is about 2 hours or longer. In addition, the e-beam or laser writing lithography system itself is very costly. Therefore, a need exists for a method and system that reduces the time and cost it takes to produce a PSM.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
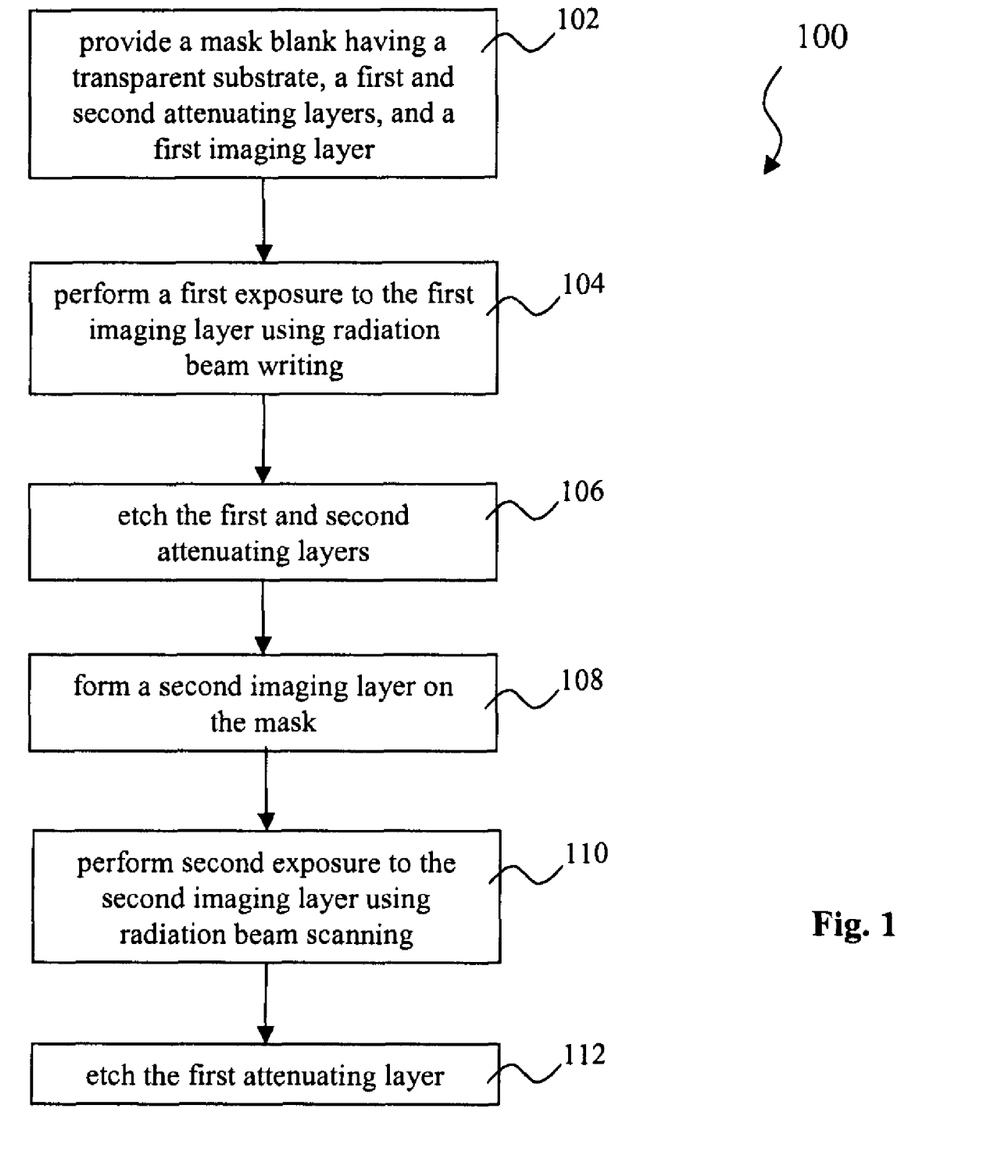
FIG. 1 is a flowchart of one embodiment of a method for making a phase shift mask.

FIG. 1 is a flowchart of a method 100 for making a phase shift mask according to one embodiment of the present invention. FIGS. 2 through 7 are sectional views of an exemplary phase shift mask 200 at various fabrication stages fabricated using the method 100. With reference to FIGS. 1 through 7, the method 100 and the phase shift mask 200 fabricated thereby are collectively described below.

Figure 2:
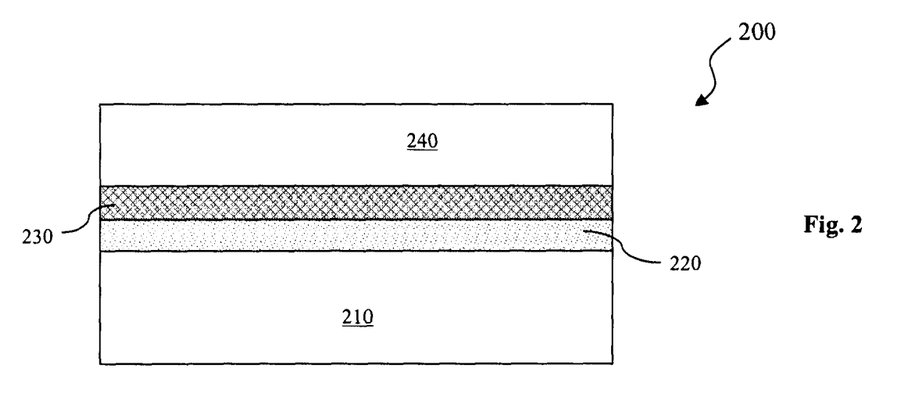
FIGS. 2 through 7 are sectional views of one embodiment of a phase shift mask at various fabrication stages fabricated using the method of FIG. 1.

The method 100 begins at step 102 by providing a mask (also referred to as a photomask or reticle) 200 having a substrate 210, a first attenuating layer 220, a second attenuating layer 230, and a first imaging layer 240, as illustrated in FIG. 2. The mask 200 described above is also referred to as a mask blank, at this stage, to be patterned to form a phase shift mask for use in semiconductor wafer fabrication. The substrate 210 is transparent and includes fused silica ($SiO_2$) relatively free of defects. The substrate 210 may alternatively include calcium fluoride, or other suitable material.

The first attenuating layer 220 is disposed on the substrate 210 and is designed to provide a phase shift to a radiation beam employed in a lithography process for semiconductor wafer fabrication. The first attenuating layer 220 may have a thickness such that the radiation beam directed toward and through the first attenuating layer 120 has a phase shift relative to the radiation beam directed through air. The radiation beam may be ultraviolet and/or can be extended to include other radiation beams such as ion beam, x-ray, extreme ultraviolet (EUV), deep ultraviolet (DUV), and other proper radiation energy. In one embodiment, the first attenuating layer 220 provides a phase shift of about 180 degrees. More specifically, the first attenuating layer 220 may have a thickness about $\lambda/[2(n-1)]$, wherein $\lambda$ is the wavelength of the radiation beam projected on the mask 100 during a photolithography process for wafer fabrication, and n is refractive index of the first attenuating layer 220 relative to the radiation beam. In another embodiment, the first attenuating layer 220 may provide a phase shift ranging between about 120 degrees and 240 degrees. Specifically, the first attenuating layer 220 may have a thickness ranging between $\lambda/[3\times(n-1)]$ and $2\lambda/[3\times(n-1)]$ to realize a desired phase shift in the above range. The first attenuating layer 220 may have a transmission less than one (or 100%) and more than zero. In one example, the first attenuating layer 220 may have a transmission higher than about 5%. The first attenuating layer 220 includes MoSi. Alternatively, the first attenuating layer 220 may include a material selected from the group consisting of metal silicide such as MoSi or $ToSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, or combinations thereof. The method of forming the first attenuating layer 220 may include chemical vapor deposition (CVD), physical vapor deposition (PVD), atomic layer deposition (ALD), plating, and/or other suitable processes.

The second attenuating layer 230 is disposed on the first attenuating layer 220. The second attenuating layer 230 is designed as an absorption layer and is opaque to the radiation beam used for lithography processing in semiconductor wafer fabrication. The second attenuating layer 230 has a transmission less than that of the first attenuating layer 220. In one embodiment, the second attenuating layer 230 has a substantially zero transmission. In another embodiment, the second attenuating layer 230 has a transmission less than about 30%. The second attenuating layer 130 may utilize a material different from that of the first attenuating layer 120. In one embodiment, the second attenuating layer 230 includes chromium. Alternatively, the second attenuating layer 230 may include a material selected from the group consisting of Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, or a combination thereof. The method of forming the second attenuating layer 230 may include CVD, PVD, plating, and/or other suitable processes.

The first imaging layer 240 is formed on the second attenuating layer 230. The imaging layer 240 is sensitive to a radiation energy employed in the first exposure described below. For example, the first imaging layer is a resist that is sensitive to an e-beam. The first imaging layer 240 can be formed by a spin-on coating method. The first imaging layer 240 may be further soft baked.

Figure 15:
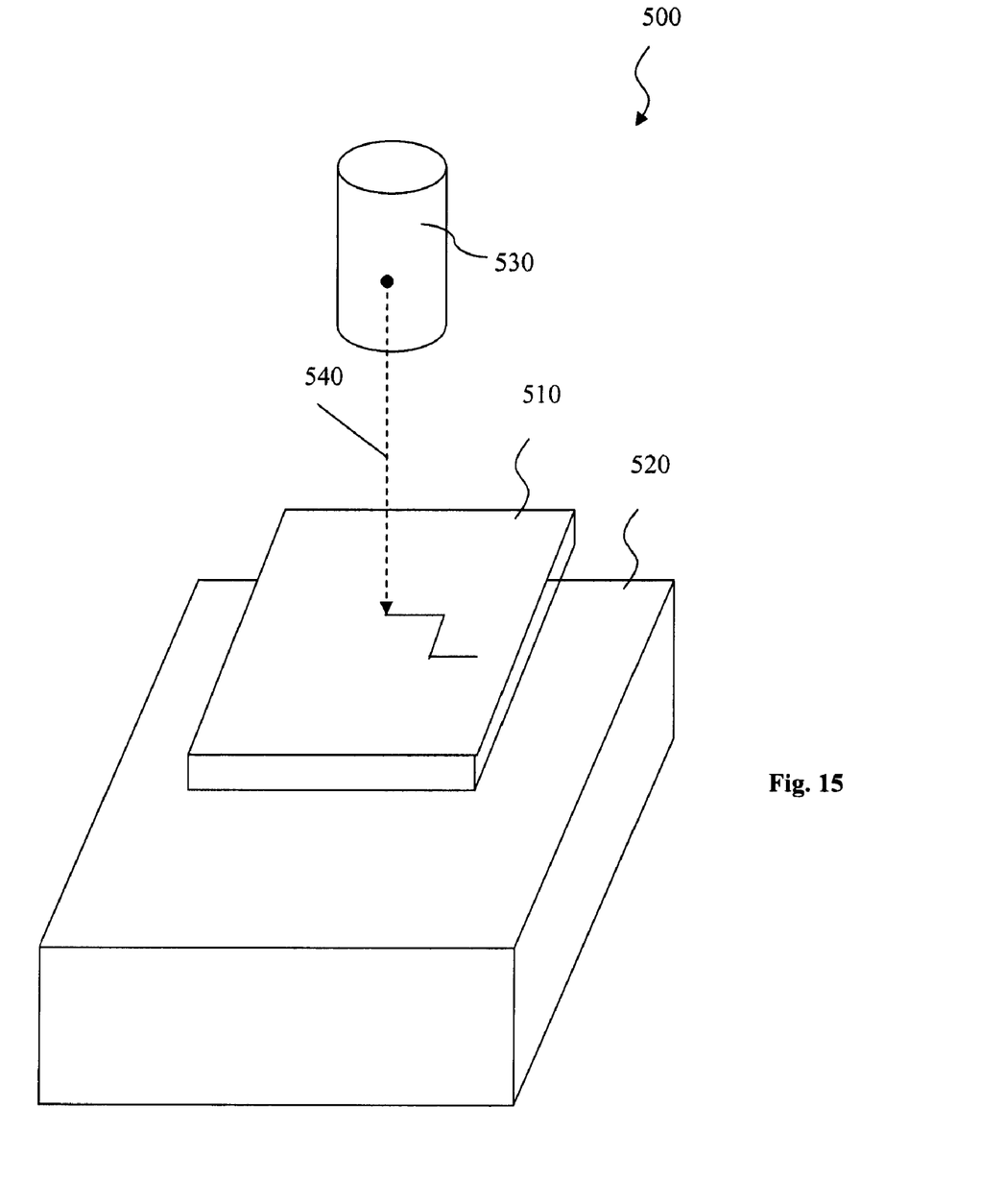
FIG. 15 is a schematic view of one embodiment of a lithography system capable of an exposure process in writing mode.

The method 100 proceeds to step 104 to perform a first exposure applied to the first resist layer 240. The first exposure to the resist layer 240 utilizes a radiation beam such as electronic beam (e-beam) to expose the resist layer 240 in a writing mode. The first exposure may utilize an e-beam writer 500 as illustrate in FIG. 15. In the e-beam writer 500, a mask 510, such as the phase shift mask 200 of FIG. 2 through FIG. 7, is supported by a substrate stage 520. An electron source 530 produces electrons that are focused in the shape of a beam 540 toward the mask 510. The electron beam 540 shines on the mask 510 in a writing mode to expose a desired pattern across an e-beam resist on the surface of the mask 510. Alternatively, a laser writer may be utilized for the first exposure by a laser beam in writing mode.

Figure 3:
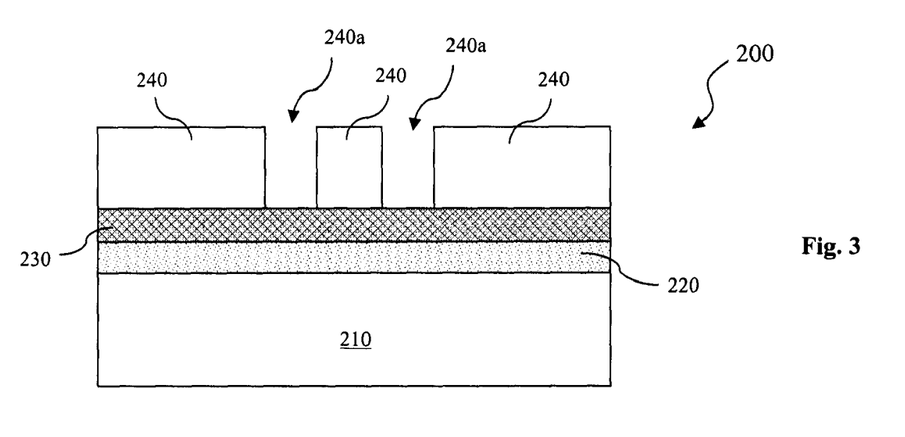

After the first exposure, other lithography processes may be applied to the imaging layer 240 to form various openings such as openings 240a and 240b, designed according to a predefined structure to be imaged onto a semiconductor wafer or other integrated circuit substrate. The second attenuating layer 230 is exposed within the openings 240a and 240b of the imaging layer 240, as illustrated in FIG. 3. The other lithography processes applied to the imaging layer 240 may include post-exposure baking, developing, and hard baking.

Figure 4:
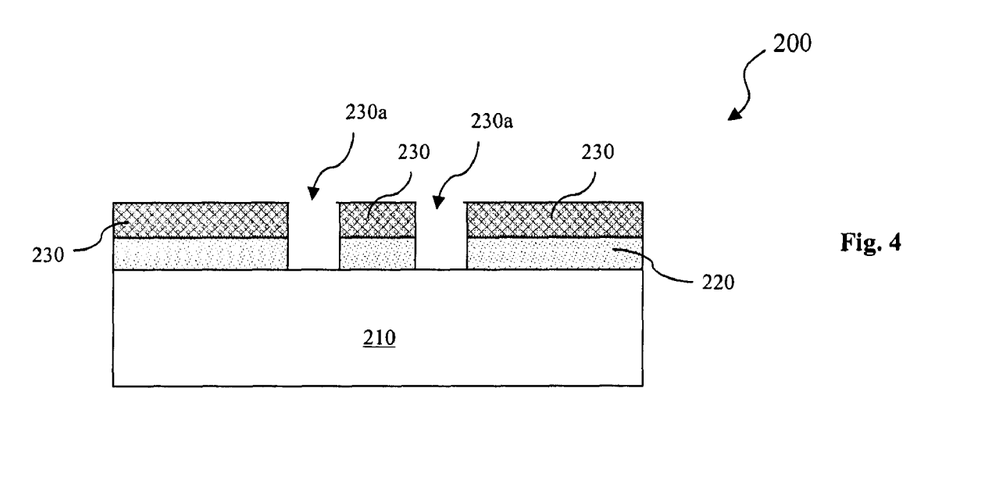

Referring to FIGS. 1 and 4, the method 100 proceeds to step 106 by etching the first and second attenuating layers through the openings 240a and 240b of the patterned imaging layer 240 to form various openings 230a and 230b through the first and second attenuating layers 220 and 230. The transparent substrate 210 is therefore exposed within the openings 230a and 230b. The etchant for etching the first and second attenuating layers 220 and 230 may be chosen or designed to have a higher etching selectivity over the transparent substrate 210. The etchant may include halogens species such as fluorine, chlorine and bromine. The first and second attenuating layers 220 and 230 may be etched separately in two etching steps each using a certain etchant. The patterned imaging layer 240 is removed after the etching process applied to the two attenuating layers 220 and 230.

Figure 5:
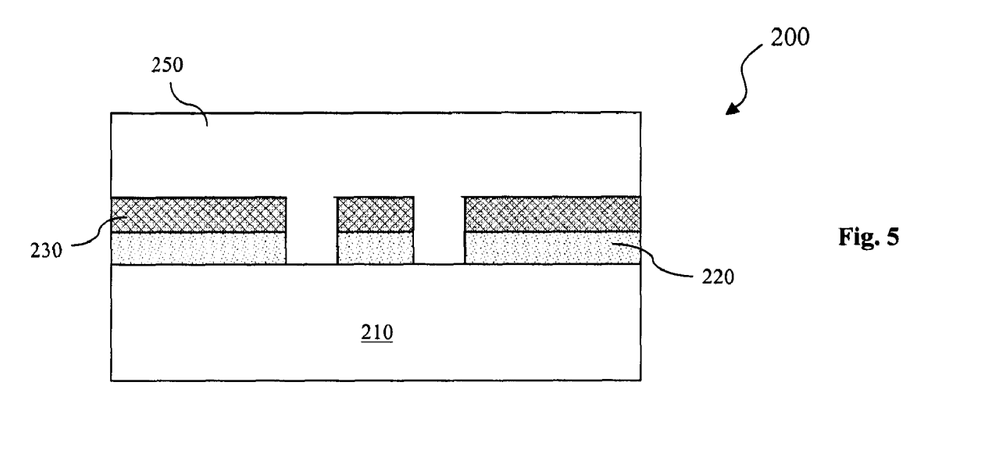

Referring to FIGS. 1 and 5, the method 100 proceeds to step 108 by forming a second imaging layer 250 on the mask 200. The second imaging layer 250, such as a photoresist (resist) layer, is sensitive to the radiation energy employed in the second exposure described below. The resist layer 250 is formed on the second attenuating layer 230 and also on the transparent substrate 210 within the openings 230a and 230b. The exemplary resist material for the second imaging layer 250 may include chemical amplification resist (CAR). The resist layer 250 may be formed by a spin-on coating process and may be thereafter soft baked.

Figure 6:
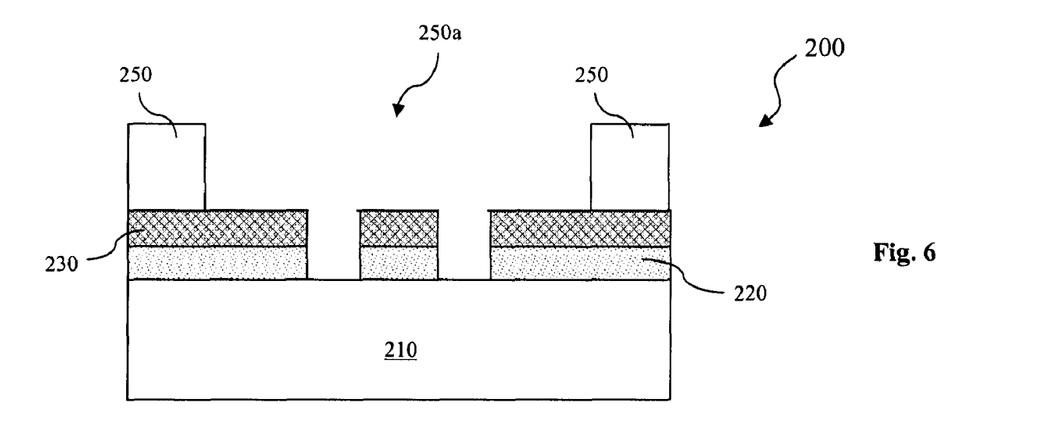
Figure 16:
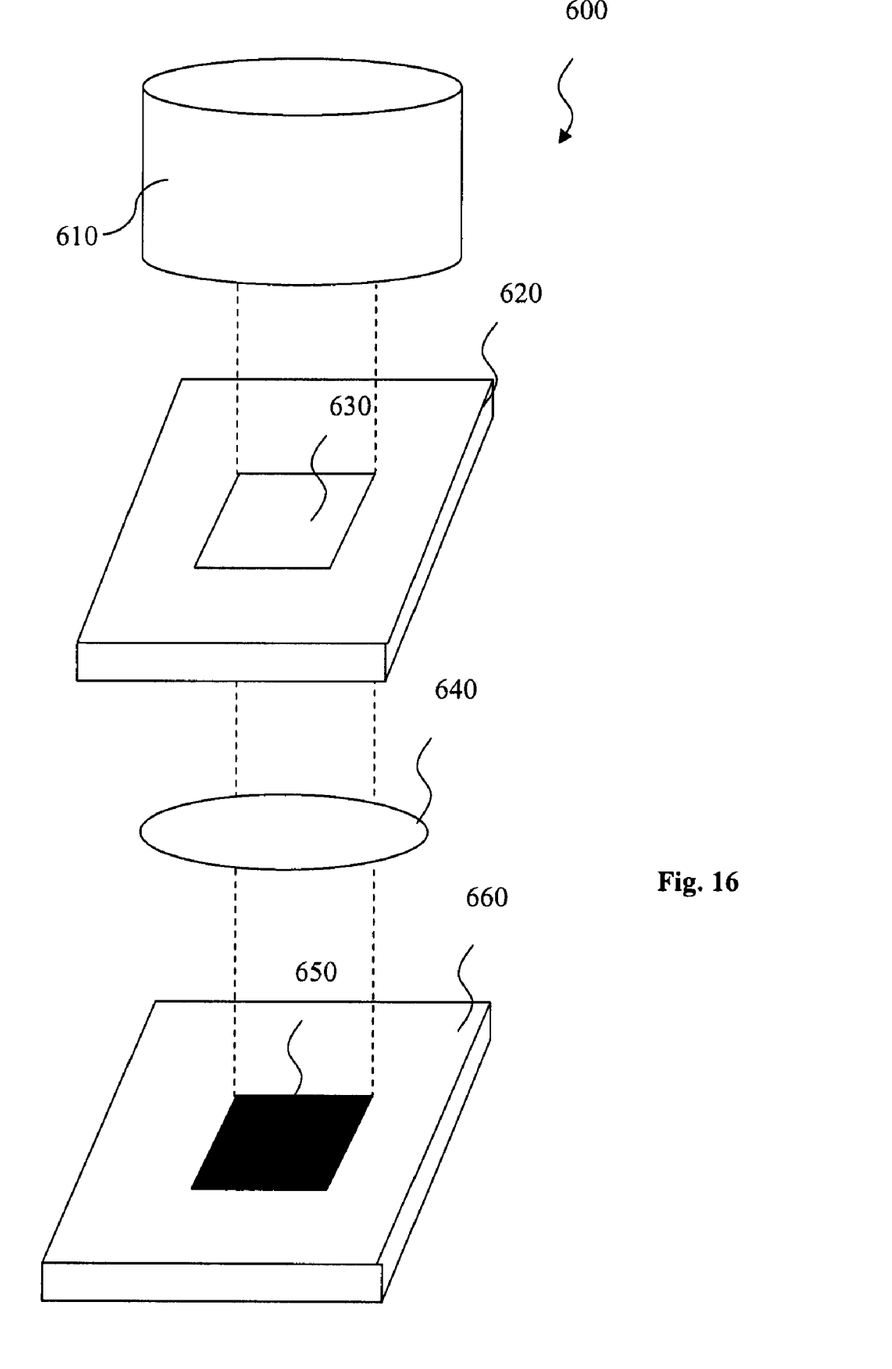
FIG. 16 is a schematic view of one embodiment of a lithography system capable of an exposure process in scanning mode.

Referring to FIGS. 1 and 6, the method 100 proceeds to step 110 by performing a second exposure to the second imaging layer 250 utilizing a radiation energy in scanning mode. The second exposure utilizes a light such as ultraviolet (UV) as the radiation energy and another mask with predefined pattern for the second exposure. The second exposure applied to the resist layer 250 utilizes a lithography exposure tool 600 to scan a predefined pattern, as illustrated in FIG. 16. The exposure system 600 includes an illumination module (e.g., a condenser) 610 having a single lens, or multiple lenses and other lens components, designed to aid in directing radiation beams from a radiation source (not shown) onto a reticle 620. The radiation source provides radiation beams with a wavelength in a range of ultra-violet (UV) or deep ultra-violet (DUV). The exposure system 600 further includes an imaging lens module 640. The imaging lens module 640 may have a single lens or a plurality of lens elements configured to project the radiation beam onto a mask 660 to be fabricated such as the phase shift mask 200 of FIG. 5. Reticle 620 includes a pattern 630. When the radiation beam passes through the imaging lens module 640 by scanning, an image 650 is exposed onto the mask 660. In one example, the imaging lens module 640 includes a 1× projection lens module or other scales of reduction lens. With exposure system 600, a single PSM for the second exposure may take about five to ten minutes instead of 2.5 hours. In addition, the exposure system 600 may be used for certain resolution patterns, such as 3 um resolution patterns. Furthermore, the exposure system 600 may have good alignment accuracy, such as 0.5 um alignment accuracy. Exposure system 600 is also less costly than a laser beam writer. By employing the exposure system 600 to perform the second exposure, the overall throughput, cycle time, and cost of producing a phase shift mask is improved. It is noted that in addition to PSM, aspects of the present disclosure may be implemented to produce other types of masks without departing the spirit and scope of the present disclosure. The exposure system 600 may further step to various subfields of the mask 200 and scan each of the subfields. The exposure system 600 may be a stepper, or a scanner in various embodiments.

After the second exposure, other lithography processes may be applied to the resist layer 250 for patterning thereof to form various openings such as an openings 250a, designed according to a predefined structure to be imaged onto a semiconductor wafer or other integrated circuit substrate. The second attenuating layer 230 and the transparent substrate 210 are exposed within the openings 250a of the resist layer 250. The other lithography processes applied to the resist layer 250 may include post-exposure baking, developing resist, and hard baking.

Figure 7:
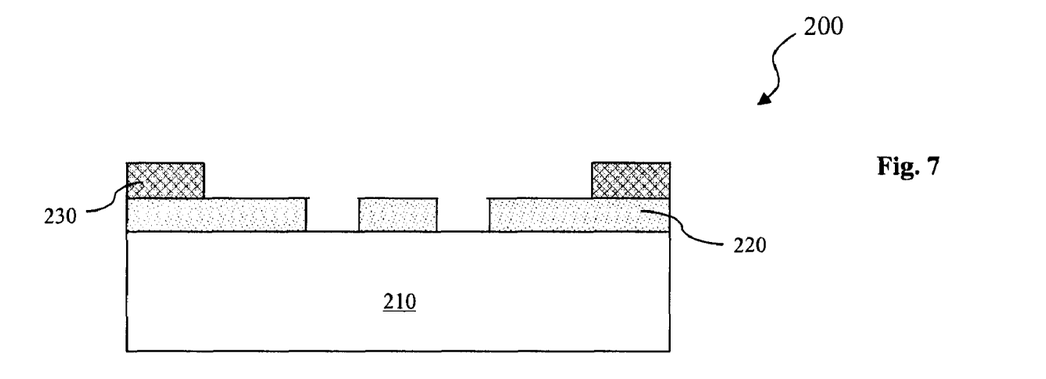
Figure 17:
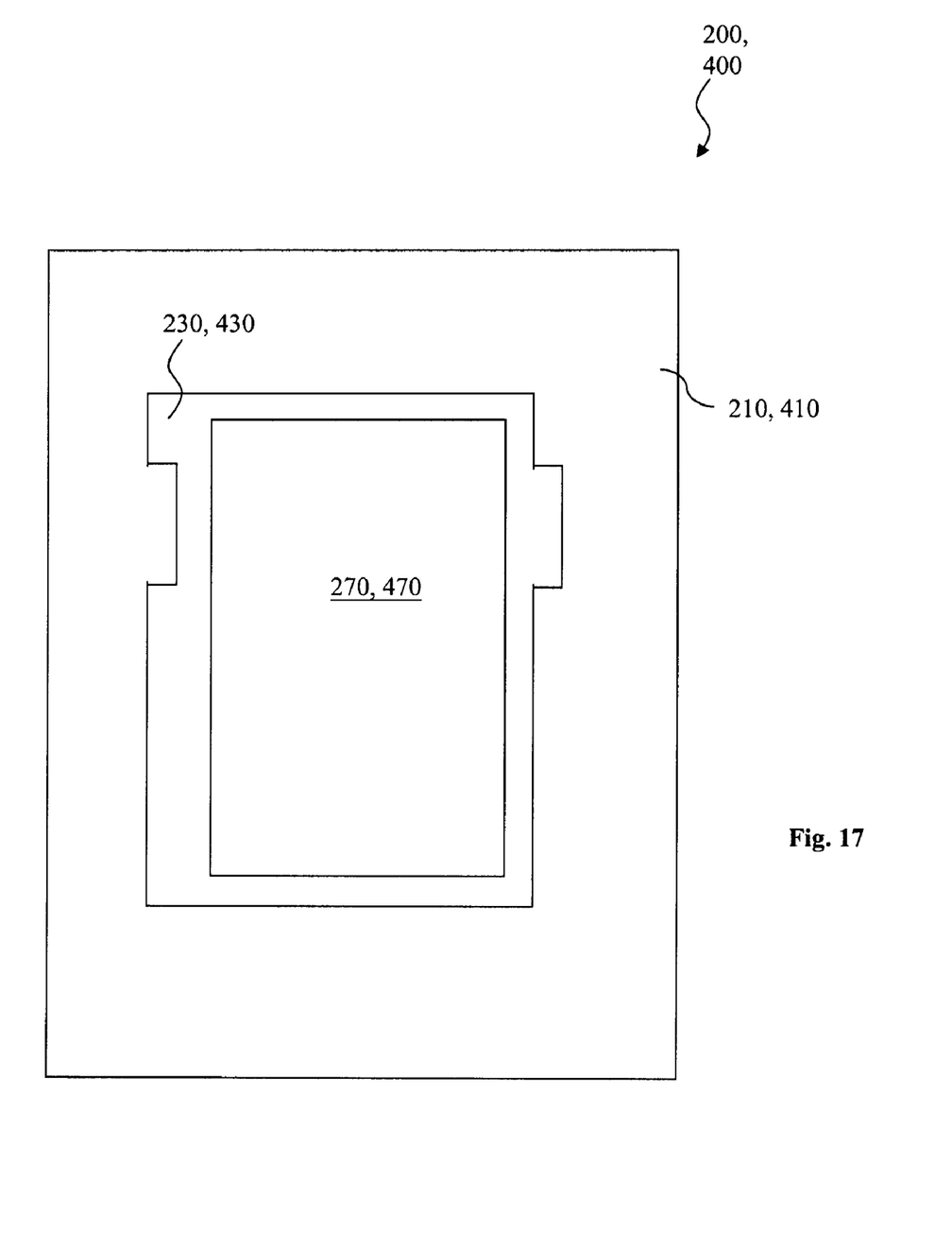
FIG. 17 is a top view of a phase shift mask fabricated using the method of FIG. 1.

Referring to FIGS. 1 and 7, the second attenuating layer 230 is selectively etched through the openings 250a of the resist layer 250 to form openings in the second attenuating layer 230 aligned with the openings 250a of the resist layer 250. The etchant to etch the second attenuating layer 230 may be designed to have a higher etching selectivity over the substrate 210 and the first attenuating layer 220. The resist layer 250 is removed thereafter, using either wet stripping or plasma ashing. In one embodiment, the patterned second attenuating layer 230 may have an exemplary structure as illustrated in FIG. 17 as a top view of the phase shift mask 200. The mask 200 includes the substrate 210, the patterned second material layer 230, and the integrated circuit (IC) cell regions 270 having the patterned first attenuating layer 200 formed thereon. The mask 200 may include other features such as various alignment marks (not shown). The patterned second attenuating layer 230 may substantially cover the frame regions to achieve a black out. Since the patterned second attenuating layer 230 has non-critical dimensions and relatively loose resolution requirement relative to the IC features formed by the first exposure, the second exposure in scanning mode can meet the resolution requirement and reduce the second exposure time and manufacturing cost. The method 100 can be implemented for making an attenuating phase shift mask in one example.

Figure 8:
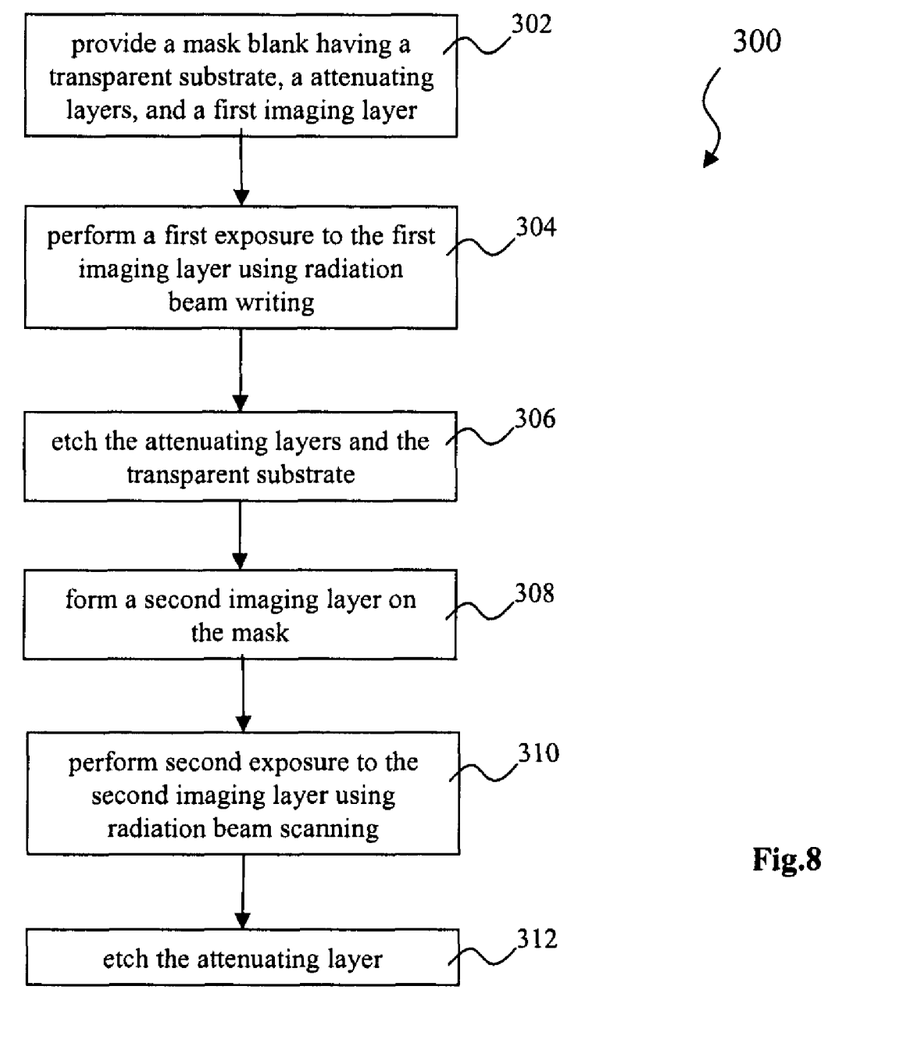
FIG. 8 is a flowchart of another embodiment of a method for making a phase shift mask.

Referring now to FIG. 8, a method 300 describes a lithography process according to another embodiment of the present disclosure. FIGS. 9 through 14 provide sectional views of an exemplary phase shift mask at various fabrication stages fabricated using the method of FIG. 8.

Figure 9:
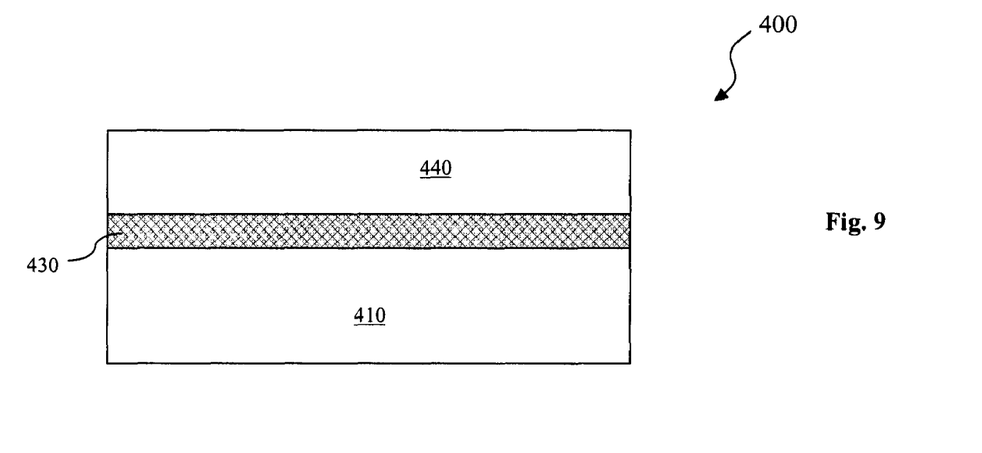
FIGS. 9 through 14 are sectional views of one embodiment of a phase shift mask at various fabrication stages fabricated using the method of FIG. 8.

The method 300 begins at step 302 by providing a mask 400 having a substrate 410, an attenuating layer 430, and a first imaging layer 440, as illustrated in FIG. 9. The mask 400 is also referred to as a mask blank, to be patterned to form a phase shift mask for use in semiconductor fabrication (such as lithography patterning processes). The substrate 410 may be substantially similar to the substrate 210 of FIG. 2.

The attenuating layer 430 is disposed on the substrate 410. The attenuating layer 430 is designed as an absorption layer and is opaque to the radiation beam used for lithography processing in semiconductor manufacturing. The attenuating layer 430 may be substantially similar to the second attenuating layer 230 of FIG. 2 in term of material. In one embodiment, the attenuating layer 430 has a transmission less than about 30%. In another embodiment, the attenuating layer 430 includes chromium. Alternatively, the attenuating layer 430 may include a material selected from the group consisting of Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, or a combination thereof. The method of forming the attenuating layer 430 may include CVD, PVD, plating, and/or other suitable processes similar to those used to form the second attenuating layer 230 of FIG. 2.

The first imaging layer 440 is formed on the substrate 410 for the first exposure and patterning described below. The first imaging layer 440 is substantially similar to that of the imaging layer 240 of FIG. 2 in terms of composition, configuration, and formation.

Figure 10:
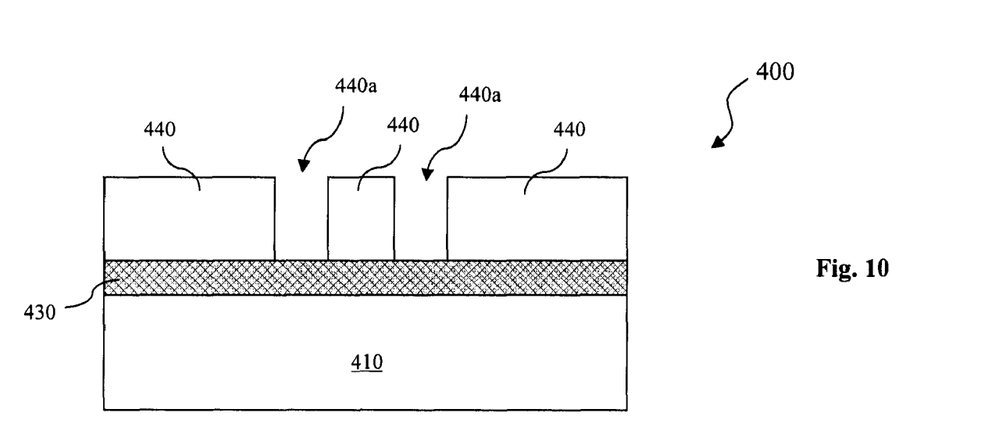

The method 300 proceeds to step 304 to perform a first exposure applied to the first imaging layer 440. The first exposure to the imaging layer 440 is substantially similar to the first exposure of the method 100 and utilizes a radiation beam such as electronic beam (e-beam) or laser beam to expose the imaging layer 440 in a writing mode. The first exposure may utilize the e-beam writer 500 of FIG. 15. After the first exposure, other lithography processes may be applied to the imaging layer 440 to form various openings such as openings 440a and 440b, designed according to a predefined structure to be imaged onto a semiconductor wafer or other integrated circuit substrate. The attenuating layer 430 is exposed within the openings 440a and 440b of the resist layer 440, as illustrated in FIG. 10. The other lithography processes applied to the resist layer 440 may include post-exposure baking, developing, and hard baking.

Figure 11:
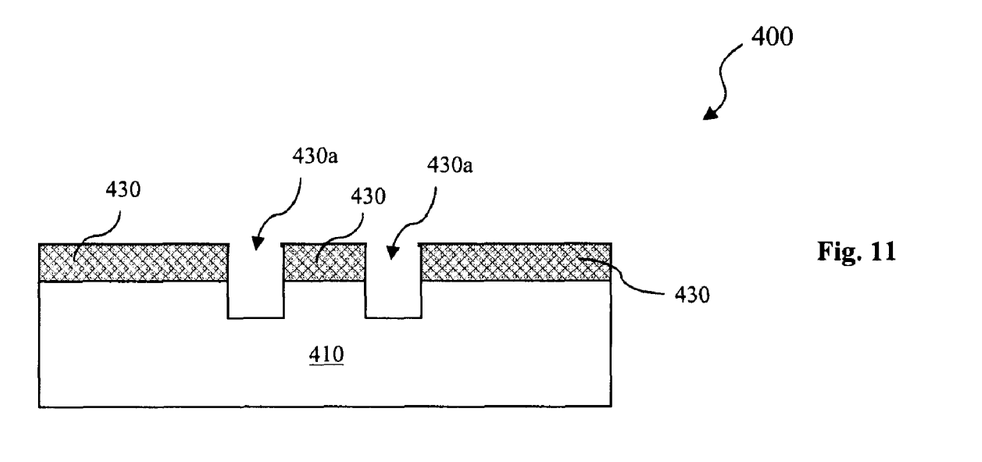

Referring to FIGS. 8 and 11, the method 300 proceeds to step 306 by etching the attenuating layer 430 through the openings 440a and 440b of the patterned imaging layer 440 to form various openings 430a and 430b through the first and second attenuating layers 420 and 430. The transparent substrate 410 is therefore exposed within the openings 430a and 430b. The etchant for etching the attenuating layer 430 may be chosen or designed to have a higher etching selectivity over the transparent substrate 410. The etchant may include halogens species such as fluorine, chlorine and bromine. The imaging layer 440 is removed after the etching process. Then the substrate 410 is etched using the attenuating layer 430 as a hard mask, to form various trenches in the substrate 410 defining phase shift features therein. Alternatively, the substrate 410 may be etched using the imaging layer 440 as a mask and the imaging layer 440 is removed thereafter. The various trenches formed in the substrate 410 may have a depth such that a radiation beam directed toward and through one of the trenches has a phase shift relative to the radiation beam directed through the unetched substrate 410. The radiation beam is referred to a radiation beam implemented to the mask 400 during a semiconductor wafer fabrication. The radiation beam may be ultraviolet and/or can be extended to include other radiation beams such as ion beam, x-ray, extreme ultraviolet (EUV), deep ultraviolet (DUV), and other proper radiation energy. In one embodiment, the trenches formed in the substrate 410 has a phase shift about 180 degrees. More specifically, the trenches in the substrate 410 may have a depth about $\lambda/[2(n-1)]$, wherein $\lambda$ is the wavelength of the radiation beam implemented to the mask 400 during semiconductor wafer fabrication, and n is refractive index of the transparent substrate 410 relative to the radiation beam. In another embodiment, the trenches in the substrate 410 may have a phase shift ranging between about 120 degrees and 240 degrees. Specifically, the trenches in the substrate 410 may have a depth ranging between $\lambda/[3\times(n-1)]$ and $2\lambda/[3\times(n-1)]$ to realize a phase shift in the desired range.

Figure 12:
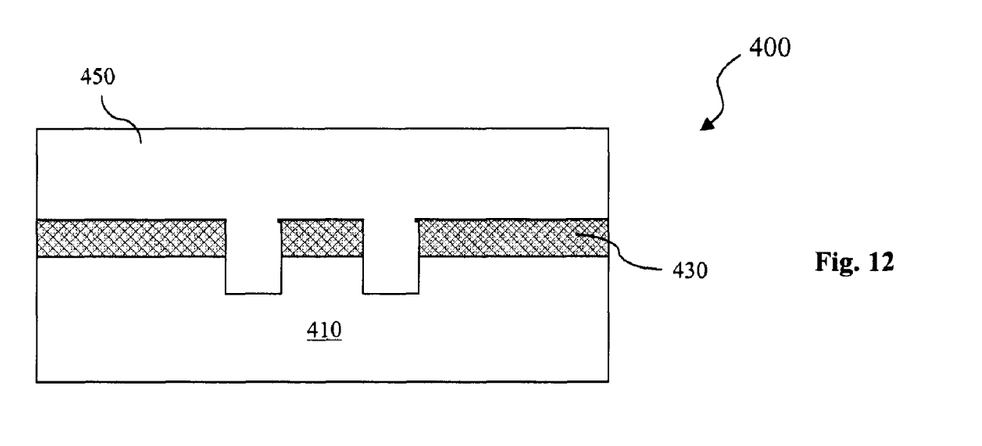

Referring to FIGS. 8 and 12, the method 300 proceeds to step 308 by forming a second imaging layer (resist layer) 450 on the mask 400. The resist layer 450 is formed on the attenuating layer 430 and also on the transparent substrate 410 within the trenches formed in the substrate 410. The exemplary resist material for the second imaging layer 450 is sensitive to the radiation beam of the second exposure described below. In one example, the second imaging layer includes chemical amplification resist. The resist layer 450 may be formed by a spin-on coating process and may be soft baked thereafter.

Figure 13:
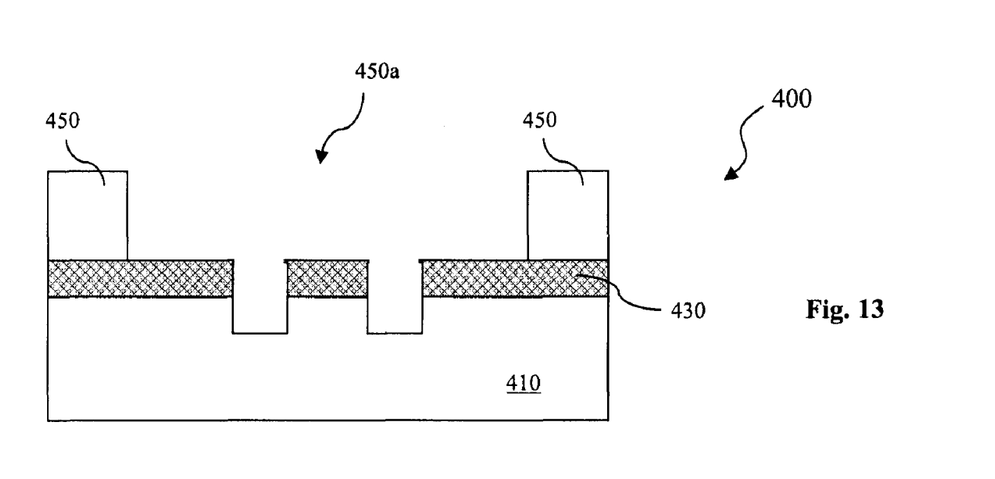

Referring to FIGS. 8 and 13, the method 300 proceeds to step 310 by performing a second exposure to the second imaging layer 450 utilizing a radiation energy in scanning mode. The second exposure utilizes a light energy such as UV light as the radiation energy and another mask having a predefined pattern for the second exposure. The second exposure applied to the resist layer 450 utilizes a lithography exposure tool such as a stepper or a scanner to scan a predefined pattern on a reticle, as illustrated in FIG. 16, in a way substantially similar to that of the second exposure of the method 100. After the second exposure, other lithography processes may be applied to the resist layer 450 to form various openings such as an openings 450a, designed according to a predefined structure to be imaged onto a semiconductor wafer or other integrated circuit substrate. The attenuating layer 430 and the transparent substrate 410 are exposed within the openings 450a of the resist layer 450. The other lithography processes applied to the resist layer 450 may include post-exposure baking, developing, and hard baking.

Figure 14:
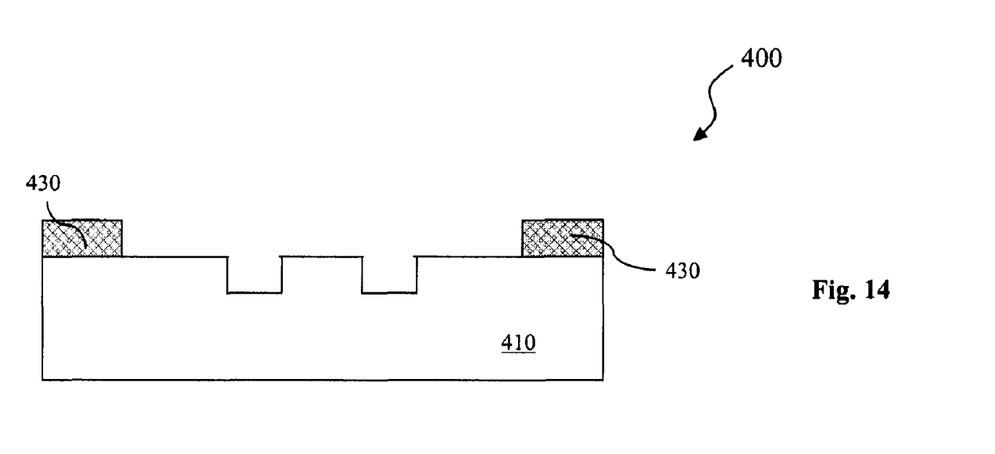

Referring to FIGS. 8 and 14, the attenuating layer 430 is selectively etched through the openings 450a of the resist layer 450 to form openings therein aligned with the openings 450a of the resist layer 450. The etchant to etch the attenuating layer 430 may be designed to have a higher etching selectivity over the substrate 410. The resist layer 450 is removed thereafter, using either wet stripping or plasma ashing. In one embodiment, the patterned attenuating layer 430 may have an exemplary structure as the attenuating layer 430 of FIG. 17 in a top view but the integrated circuit (IC) cell regions 470 includes various chromeless phase shift features formed in the substrate 410 by the previous steps. Since the patterned attenuating layer 430 has non-critical dimensions and relatively loose resolution requirement relative to the IC features formed in the substrate, the lithography exposure in scanning mode can meet the resolution requirement and reduce the second exposure time and manufacturing cost. The method 300 can be implemented to mask a chromeless phase shift mask as detailed above.

The processes making a phase shift mask, are described in embodiments for making various phase shift masks including attenuating phase shift mask and chromeless phase shift mask. Other masks may be formed by the disclosed method utilizing the first exposure in writing mode with e-beam or laser beam to pattern critical features in a first layer and utilizing the second exposure in scanning mode with UV and a mask to pattern non-critical features in a second layer. The disclosed method may have variations without departure from the spirit and the scope of the present disclosure. For example, the phase shift mask 200 may be extended to include more then two attenuating layers to realize multiple phase-shift assistant features. In further embodiment, each attenuating layer may include more than one film for optimized manufacturing and performance. The masks 200 and/or 400 may not only be used to fabricate a semiconductor wafer, but may be alternatively used to pattern other substrates such as a glass substrate used to form a thin film transistor liquid crystal display (TFT-LCD) substrate. The phase shift structures formed in the IC region such as attenuating phase shift mask 200 and chromeless phase shift mask 400 may include not only IC features but also various optical proximity correction (OPC) features to enhance the lithography patterning resolution when using the above phase shift masks for IC fabrication. For example, assistant features such as scattering bars may be added and formed on the mask with IC features in phase shift. The above methods for fabricating a phase shift mask may be implemented in different sequence. In one embodiment for making the mask 200, the second attenuating layer is patterned utilizing an exposure in scanning mode and then the first attenuating layer is patterned thereafter utilizing another exposure in writing mode. In another embodiment for making the mask 400, the attenuating layer is patterned utilizing an exposure in scanning mode and then the transparent substrate is patterned thereafter utilizing another exposure in writing mode. In another embodiment for making the mask 200, after the first exposure applied to the first imaging layer, the second attenuating layer is etched. Then the imaging layer is removed. Thereafter the first attenuating layer is etched using the second attenuating layer as a hard mask. To implement the first exposure and second exposure described above, the e-beam system 500 and the exposure system 600 may be integrated for both mechanisms and functions such that the first and second exposures can be all implemented therein for mask manufacturing efficiency and quality. In another embodiment, the e-beam system 500 may be alternatively replaced by a laser writer.

Thus the present disclosure provides a method of making a mask. The method includes providing a substrate having a first attenuating layer on the substrate and a first imaging layer on the first attenuating layer; performing a first exposure to the first imaging layer using a first radiation energy in writing mode; performing a first etching to the first attenuating layer; performing a second etching to the substrate; forming a second imaging layer on the first attenuating layer and the substrate; performing a second exposure to the second imaging layer using a light energy and another mask; and performing a third etching to the first attenuating layer after the second exposure.

As one example of the method, the substrate may include a transparent substrate and a second attenuating layer disposed on the transparent substrate. The second etching includes etching the second attenuating layer to form phase shift features. The first attenuating layer includes MoSi and the second attenuating layer include chrome. In another example of the method, the substrate includes a transparent material layer and the first attenuating layer includes chrome adjacent to the transparent material layer. The second etching includes etching the transparent material layer to form phase shift features. In one example, the first radiation energy includes an electronic beam (e-beam). In another example, the first radiation energy includes an ultra-violet (UV) beam from a light source.

The present disclosure also provides another embodiment of a method for masking phase shift mask. The method includes providing a mask blank having a transparent substrate; a first attenuating layer on the transparent substrate; a second attenuating layer on the first attenuating layer; and a first imaging layer on the second attenuating layer. The method also includes performing a first exposure to the first imaging layer using a first radiation energy in writing mode; thereafter performing a first etching to the first attenuating layer and the second attenuating layer; forming a second imaging layer on the first attenuating layer and the transparent substrate; performing a second exposure to the second imaging layer using a second radiation energy in scanning mode; and thereafter performing a second etching to the first attenuating layer.

In this method, the first radiation energy may include an e-beam. The second radiation energy may include ultraviolet light. The second exposure may include utilizing another mask. The method may further include removing the first imaging layer after the first etching. The method may further include removing the second imaging layer after the second etching. In this method, the first attenuating layer may include MoSi. The second attenuating layer may include Cr. Alternatively, the first attenuating layer may include a material selected from the group consisting of MoSi, ToSi$_2$, iron oxide, inorganic material, Mo, Nb$_2$O$_5$, Ti, Ta, CrN, MoO$_3$, MoN, Cr$_2$O$_3$, TiN, ZrN, TiO$_2$, TaN, Ta$_2$O$_5$, SiO$_2$, NbN, Si$_3$N$_4$, ZrN, Al$_2$O$_3$N, and combinations thereof. The second attenuating layer may include a material selected from the group consisting of Cr, CrN, Mo, Nb$_2$O$_5$, Ti, Ta, CrN, MoO$_3$, MoN, Cr$_2$O$_3$, TiN, ZrN, TiO$_2$, TaN, Ta$_2$O$_5$, SiO$_2$, NbN, Si$_3$N$_4$, ZrN, Al$_2$O$_3$N, and combinations thereof.

The present disclosure also provides another embodiment of a method for making a phase shift mask. The method includes providing a substrate having a phase shift layer on the substrate, and an attenuating layer on the phase shift layer; performing a first exposure of the phase shift layer and the attenuating layer using an electronic beam (e-beam); performing a first etching to the phase shift layer and the attenuating layer to define a device pattern; performing a second exposure of the attenuating layer using a light source and a mask; and performing a second etching to the attenuating layer. In this method, the attenuating layer may include Cr. The phase shift layer may include MoSi.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
providing a substrate having a first attenuating layer on the substrate and a first imaging layer on the first attenuating layer;
patterning the first imaging layer, including performing a first exposure to the first imaging layer using a first radiation energy in writing mode and performing a first development process;
performing a first etching to pattern the first attenuating layer using the patterned first imaging layer as a mask;
performing a second etching to the substrate;
forming a second imaging layer on the patterned first attenuating layer and the etched substrate;
positioning a mask between a light source and the second imaging layer, the mask being spaced from the second imaging layer;
patterning the second imaging layer, including performing a second exposure to the second imaging layer using a light energy from the light source and the mask and performing a second development process; and
after the patterning the second imaging layer, performing a third etching to the patterned first attenuating layer, wherein the patterned first attenuating layer is patterned via the third etching such that a portion of the patterned first attenuating layer substantially covers a frame region to achieve a black out.

2. The method of claim 1, wherein the substrate comprises a transparent substrate and a second attenuating layer disposed on the transparent substrate.

3. The method of claim 2, wherein performing the second etching comprises etching the second attenuating layer to form phase shift features.

4. The method of claim 2, wherein the first attenuating layer includes MoSi and the second attenuating layer includes chrome.

5. The method of claim 1, wherein the substrate includes a transparent material layer and the first attenuating layer includes chrome adjacent to the transparent material layer.

6. The method of claim 5, wherein performing the second etching comprises etching the transparent material layer to form phase shift features.

7. The method of claim 1, wherein the first radiation energy comprises an electron beam (e-beam).

8. The method of claim 1, wherein the light energy comprises an ultra-violet beam from the light source.

9. A method, comprising:
providing a mask blank having a transparent substrate, a first attenuating layer on the transparent substrate, a second attenuating layer on the first attenuating layer, and a first imaging layer on the second attenuating layer;
patterning the first imaging layer, including performing a first exposure to the first imaging layer using a first radiation energy in writing mode and performing a first development process;
after the patterning of the first imaging layer, patterning the first attenuating layer and the second attenuating layer using the patterned first imaging layer as a mask, the patterning including a first etching;
forming a second imaging layer on the patterned second attenuating layer and the transparent substrate;
patterning the second imaging layer, including performing a second exposure to the second imaging layer using a second radiation energy in scanning mode, including directing the second radiation energy through a reticle and onto the second imaging layer to scan a predefined pattern, the reticle being spaced from the second imaging layer, wherein the patterning of the second imaging layer further includes performing a second development process; and
after the patterning of the second imaging layer, performing a second etching to the patterned second attenuating layer, wherein the second attenuating layer is patterned a second time via the second etching such that the second attenuating layer substantially covers a frame region to achieve a black out.

10. The method of claim 9 wherein the first radiation energy comprises an e-beam.

11. The method of claim 9, wherein the second radiation energy comprises an ultraviolet light.

12. The method of claim 9, wherein performing the second exposure includes directing the second radiation energy through a lens module positioned between the reticle and the second imaging layer to project the second radiation energy onto the second imaging layer.

13. The method of claim 9, further comprising removing the first imaging layer after the first etching.

14. The method of claim 9, further comprising removing the second imaging layer after the second etching.

15. The method of claim 9, wherein the first attenuating layer comprises MoSi.

16. The method of claim 9, wherein the second attenuating layer comprises chrome.

17. The method of claim 9, wherein the first attenuating layer comprises a material selected from the group consisting of MoSi, iron oxide, inorganic material, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, and combinations thereof.

18. The method of claim 9, wherein the second attenuating layer comprises a material selected from the group consisting of Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, and combinations thereof.

19. A method, comprising:
providing a substrate having a first attenuating layer on the substrate and a first imaging layer on the first attenuating layer;
patterning the first imaging layer to expose a first portion of the first attenuating layer, wherein the patterning of the first imaging layer includes performing a first exposure to the first imaging layer using a first radiation energy in writing mode and performing a first development process;
performing a first etching to the exposed first portion of the first attenuating layer to expose a portion of the substrate;
removing the first imaging layer after performing the first etching;
performing a second etching to the exposed portion of the substrate;
forming a second imaging layer on the first attenuating layer and the exposed portion of the substrate;
positioning a mask between a light source and the second imaging layer, the mask being spaced from the second imaging layer;
patterning the second imaging layer to expose a second portion of the first attenuating layer, wherein the patterning of the second imaging layer includes performing a second exposure to the second imaging layer using a light energy from the light source and the mask and performing a second development process; and
after the patterning of the second imaging layer, performing a third etching to the exposed second portion of the first attenuating layer, wherein the exposed second portion of the first attenuating layer is patterned via the third etching such that the first attenuating layer substantially covers a frame region to achieve a black out.

20. A method, comprising:

providing a mask blank having a transparent substrate, a first attenuating layer on the transparent substrate, a second attenuating layer on the first attenuating layer, and a first imaging layer on the second attenuating layer;

patterning the first imaging layer to expose a first portion of the second attenuating layer, wherein the patterning of the first imaging layer includes performing a first exposure to the first imaging layer using a first radiation energy in writing mode and performing a first development process;

after the patterning of the first imaging layer, performing a first etching to the exposed first portion of the second attenuating layer and the first attenuating layer to expose a portion of the transparent substrate;

removing the first imaging layer after the performing of the first etching;

forming a second imaging layer on the patterned second attenuating layer and the exposed portion of the transparent substrate;

patterning the second imaging layer to expose a second portion of the second attenuating layer, wherein patterning the second imaging layer includes performing a second exposure to the second imaging layer using a second radiation energy in scanning mode, including directing the second radiation energy through a reticle and onto the second imaging layer to scan a predefined pattern, the reticle being spaced from the second imaging layer, wherein the patterning of the second imaging layer further includes performing a second development process; and after the patterning of the second imaging layer, performing a second etching to the exposed second portion of the second attenuating layer, wherein the exposed second portion of the second attenuating layer is patterned via the second etching such that the second attenuating layer substantially covers a frame region to achieve a black out.

\* \* \* \* \*